(12) United States Patent
McShane et al.

(10) Patent No.: US 9,099,475 B2
(45) Date of Patent: Aug. 4, 2015

(54) TECHNIQUES FOR REDUCING INDUCTANCE IN THROUGH-DIE VIAS OF AN ELECTRONIC ASSEMBLY

(75) Inventors: Michael B. McShane, Austin, TX (US); Kevin J. Hess, Austin, TX (US); Perry H. Pelley, Austin, TX (US); Tab A. Stephens, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 414 days.

(21) Appl. No.: 13/611,076

(22) Filed: Sep. 12, 2012

(65) Prior Publication Data

US 2014/0071652 A1    Mar. 13, 2014

(51) Int. Cl.
H05K 1/00    (2006.01)
H05K 7/00    (2006.01)
G02B 6/12    (2006.01)
H01L 23/02    (2006.01)
H01L 23/48    (2006.01)
(Continued)

(52) U.S. Cl.
CPC .............. *H01L 23/538* (2013.01); *H01L 24/24* (2013.01); *H01L 25/04* (2013.01); *H01L 25/0657* (2013.01); H01L 24/16 (2013.01); H01L 24/32 (2013.01); H01L 24/73 (2013.01); H01L 24/82 (2013.01); H01L 2224/131 (2013.01); H01L 2224/16146 (2013.01); H01L 2224/245 (2013.01); H01L 2224/24146 (2013.01); H01L 2224/2518 (2013.01); H01L 2224/32135 (2013.01); H01L 2224/73217 (2013.01); H01L 2224/73259 (2013.01); H01L 2224/8203 (2013.01); H01L 2224/82101 (2013.01); H01L 2224/83 (2013.01); H01L 2224/9202 (2013.01); H01L 2224/92144 (2013.01); H01L 2224/94 (2013.01); H01L 2224/97 (2013.01)

(58) Field of Classification Search
CPC ....... H01L 23/538; H01L 24/24; H01L 25/04; H01L 25/0657; H01L 2224/131; H01L 2224/16146; H01L 2224/32135; H01L 2224/9202; H01L 2224/92144; H01L 2224/73217; H01L 2224/8203; H01L 2224/94; H01L 2224/2518; H01L 2224/24146; H01L 2224/97; H01L 2224/82101; H01L 2224/245; H01L 2224/73259; H01L 24/16; H01L 24/73; H01L 24/82; H01L 24/32
USPC ............. 361/751, 735, 820; 385/14; 257/686, 257/777; 365/64

See application file for complete search history.

(56) References Cited

U.S. PATENT DOCUMENTS 7,795,073 B2 *   9/2010   Han et al. .................. 438/106
7,834,440 B2 * 11/2010   Ito et al. .................... 257/686

(Continued)

OTHER PUBLICATIONS

Michael B. Healy et al., Design and Analysis of 3D-Maps: A Many-Core 3D Processor with Stacked Memory, Georgia Institute of Technology.

(Continued)

*Primary Examiner* — Courtney Smith
*Assistant Examiner* — Zhengfu Feng
(74) *Attorney, Agent, or Firm* — Yedell Isidore PLLC

(57) ABSTRACT

An electronic assembly includes a processor die assembly, a first die assembly, and a second die assembly. The first die assembly is positioned on a first side of the processor die assembly. The second die assembly is positioned on a second side of the processor die assembly opposite the first side of the processor die assembly. Through-die vias couple the first and second die assemblies to the processor die assembly.

19 Claims, 2 Drawing Sheets

(51) Int. Cl.
*G11C 5/06* (2006.01)
*H01L 23/538* (2006.01)
*H01L 25/04* (2014.01)
*H01L 25/065* (2006.01)
*H01L 23/00* (2006.01)

(56) References Cited

U.S. PATENT DOCUMENTS

| | | | |
|---|---|---|---|
| 7,893,526 B2* | 2/2011 | Mun et al. | 257/691 |
| 8,563,403 B1* | 10/2013 | Farooq et al. | 438/459 |
| 2009/0103345 A1* | 4/2009 | McLaren et al. | 365/64 |
| 2010/0176506 A1* | 7/2010 | Hsu et al. | 257/698 |

OTHER PUBLICATIONS

Gabriel H. Loh, 3D-Stacked Memory Architectures for Multi-Core Processors, Proceedings of the 35th ACM/IEEE International Conference on Computer Architecture, Jun. 2008.

Hong Sangki, 3D Super-Via for Memory Applications, Tezzaron Semiconductor Corporation, Micro-Systems Packaging Initiative (MSPI) Packaging Workshop 2007.

Dong Hyuk Woo, An Optimized 3D-Stacked Memory Architecture by Exploiting Excessive, High-Density TSV Bandwidth, School of Electrical and Computer Engineering Georgia Institute of Technology, Atlanta GA 30332.

* cited by examiner

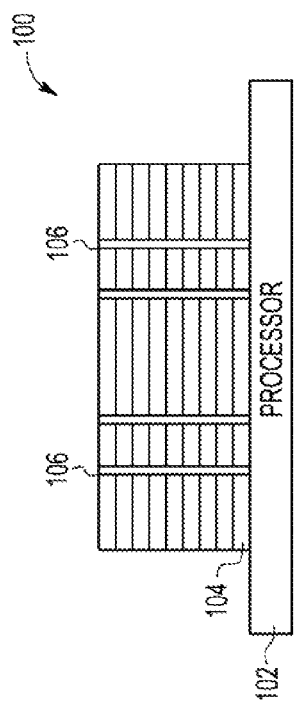
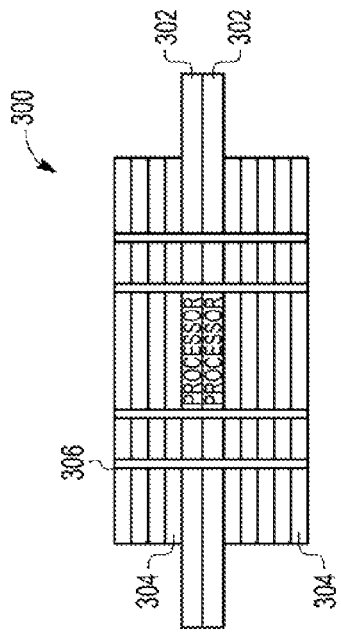
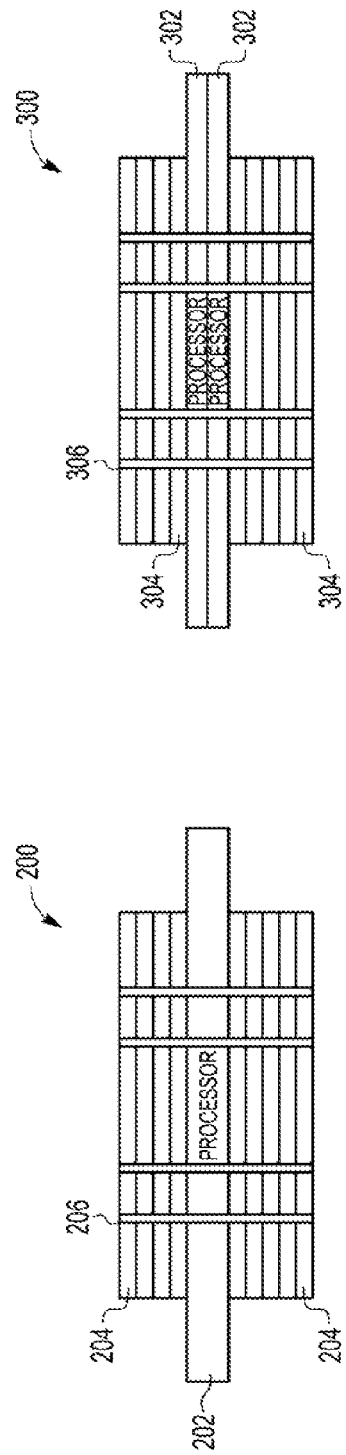
FIG. 1 -PRIOR ART-
FIG. 2
FIG. 3

US 9,099,475 B2

TECHNIQUES FOR REDUCING INDUCTANCE IN THROUGH-DIE VIAS OF AN ELECTRONIC ASSEMBLY

BACKGROUND

1. Field

This disclosure relates generally to an electronic assembly and, more specifically, to techniques for reducing inductance in through-die vias of an electronic assembly.

2. Related Art

Various approaches have been utilized or proposed for building three-dimensional (3D) integrated circuits (ICs). As one example, 3D ICs may be built using a monolithic approach, where electronic components and their connections are built in layers on a single semiconductor wafer that is diced into multiple 3D ICs. In this case, as there is only one die, there is no need for aligning, thinning, or bonding multiple die, or implementing through-silicon vias (TSVs). As is known, a TSV is a vertical electrical connection that passes completely through a silicon wafer or die and may optionally extend through layers of devices and interconnects formed on a surface of the silicon wafer or die. As another example, 3D ICs may be built using a wafer-on-wafer approach, where electronic components are built on two or more semiconductor wafers that are then aligned, bonded, and diced into 3D ICs. Each wafer may be thinned before or after bonding. Vertical connections are usually either built into the stacked wafers before bonding or are created in the wafer stack after bonding. For example, in the wafer-on-wafer approach, TSVs may be implemented that pass through a silicon substrate or substrates between active layers and/or between an active layer and an external bond pad.

As another example, a 3D IC may be built using a die-on-wafer approach, where electronic components are built on two semiconductor wafers. A first wafer is then diced and the singulated die are aligned and bonded onto die sites of a second wafer. As in the wafer-on-wafer approach, thinning and TSV creation may be performed either before or after bonding. Additional die may be added to the die-on-wafer stacks before dicing. As another example, a 3D IC may be built using a die-on-die approach, where electronic components are built in multiple die, which are then aligned and bonded. In the die-on-die approach, thinning and TSV creation may be done before or after bonding. One advantage of the die-on-die approach is that each component die can be tested before insertion into a die-on-die stack, such that one non-functional die does not ruin an entire die-on-die stack. Moreover, each die that is to be utilized in a die-on-die stack can be binned, so that the die can be mixed and matched to optimize power consumption and performance (e.g., matching multiple die from a low power process corner for a mobile application).

As yet another example, a 3D IC may be built using a package-on-package (PoP) approach, which is an IC packaging technique that combines vertically discrete logic and memory ball grid array (BGA) packages. Two or more packages are stacked and a standard interface is usually employed to route signals between the packages. The PoP approach facilitates relatively high component density and has been employed in various portable electronic devices, e.g., mobile phones, personal digital assistants (PDAs), and digital cameras. Known PoP configurations have utilized pure memory stacking (with two or more memory only packages stacked on each other) and mixed logic-memory stacking (where a memory package is stacked on one side of a logic (central processing unit (CPU)) package, i.e., opposite a motherboard.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 1 is a diagram of a conventional electronic assembly that includes eight memory die stacked on one side of a processor die.

FIG. 2 is a diagram of an electronic assembly that includes four memory die stacked on each side of a processor die according to an embodiment of the present invention.

FIG. 3 is a diagram of an electronic assembly that includes first and second processor die stacked back-to-back with four memory die stacked on one side of the first processor die and four memory die stacked on one side of the second processor die according to another embodiment of the present invention.

DETAILED DESCRIPTION

Figure 4:
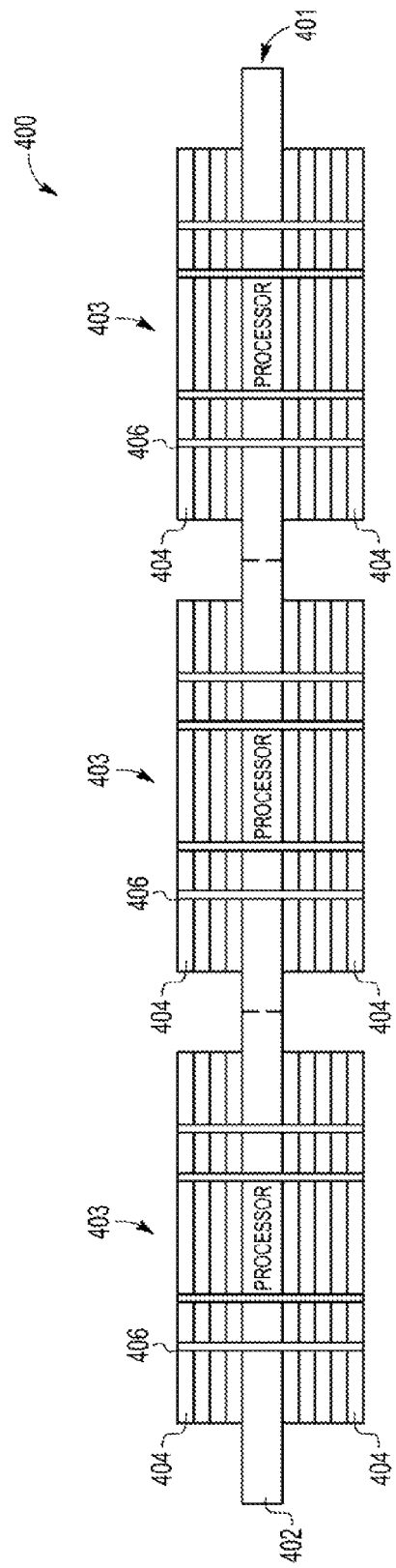
FIG. 4 is a diagram of multiple electronic assemblies whose respective processor die are formed within a wafer with each of the processor die having four memory die stacked on each side according to an embodiment of the present invention.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims and their equivalents.

In general, a vertical interception access (via) is a vertical metal conductor that electrically connects different levels of interconnects. For example, a via may provide a vertical electrical connection between different layers of conductors in a physical electronic circuit, e.g., a semiconductor die. In integrated circuit (IC) design, a via usually takes the form of an opening in an insulating layer that allows a conductive connection between different layers. A through-via of an IC is often called a through-silicon via (TSV). A "contact" is a specialized via that directly connects a first level of interconnect to devices built in a semiconductor substrate. It should be appreciated that a through-via is not limited to silicon, e.g., a through-via may be implemented in other semiconductor materials such as gallium-arsenide. As may be used herein, the term 'coupled' includes a direct electrical connection between elements or components and an indirect electrical connection between elements or components achieved using one or more intervening elements or components.

Conventionally, stacks of memory die have been stacked on a processor die to form an electronic assembly whose component dies are interconnected using TSVs. As one example, a conventional electronic assembly has included eight memory die stacked on one side of a processor die. Unfortunately, in the conventional electronic assembly, inductance of TSVs that couple the memory die to the processor die may limit the performance of the electronic assembly.

According to various aspects of the present disclosure, instead of locating all memory die on one side of a processor die of an electronic assembly, a first portion of the memory die are located on a first side of the processor die and a second portion of the memory die are located on a second side of the processor die, which is opposite the first side of the processor die. For example, in contrast with placing eight memory die on one side of a processor die, four die may be placed on each side of the processor die. In general, placing memory die on each side of a processor die reduces the inductance of the TSVs that interconnect the memory die to a processor die and allow for a higher operating frequency. Since inductance scales with the length of an electrical connection, reducing the length of an electrical connection is advantageous to electrical performance.

For example, in an electronic assembly that implements eight memory die, placing four memory die on each side of the processor die reduces the inductance of the TSVs by about one-half (as compared to an electronic assembly that places all eight memory die on one side of a processor die), allows for a higher operating frequency (e.g., about a doubling of operating frequency), and lower power consumption. According to another embodiment, two processor die may be placed back-to-back with four memory die stacked on an active side of each processor die. In general, the performance of an electronic assembly that includes a processor die assembly (including two or more stacked processor die) with memory die stacked on each side of the processor die assembly is improved due to reduced inductance of TSVs that couple the memory die to the processor die assembly.

According to one or more aspects of the present disclosure, an electronic assembly includes a processor die assembly, a first die assembly, and a second die assembly. The first die assembly is positioned on a first side of the processor die assembly. The second die assembly is positioned on a second side of the processor die assembly opposite the first side of the processor die assembly. Through-die vias couple the first and second die assemblies to the processor die assembly. For example, the first and second die assemblies may include an equal number of memory die (or in some cases a different number of memory die) and the through-die vias may include TSVs that carry address, data, and control signals, as well as power and ground. For example, during assembly, the TSVs may be filled substantially simultaneously with a desired conductor.

With reference to FIG. 1, a conventional electronic assembly 100 is illustrated that includes eight memory die (e.g., double data rate type 3 (DDR3) synchronous dynamic random access memory (SDRAM) die) 104 stacked on one side of a processor die 102. As is illustrated, the memory die 104 and the processor die 102 are coupled to each other using through-silicon vias (TSVs) 106. As noted above, stacking all of the memory die 104 on one-side of the processor die 102 results in increased inductance of the TSVs 106 and may reduce the performance of the electronic assembly 100. It should be noted that the TSVs 106 do not extend through the processor die 102 of the electronic assembly 100.

With reference to FIG. 2, an electronic assembly 200 is illustrated that is configured according to one embodiment the present disclosure. As is illustrated, the electronic assembly 200 includes four memory die (e.g., double data rate type 3 (DDR3) synchronous dynamic random access memory (SDRAM) die, or other type of memory die) 204 stacked on each side of a processor die 202. While four stacked die are illustrated on each side of a processor die, it is contemplated that more or less than four stacked die may be located on each side of a processor die in an electronic assembly configured according to the present disclosure.

As is illustrated, the memory die 204 and the processor die 202 are coupled to each other using through-silicon vias (TSVs) 206, which may be formed using various known techniques. For example, the TSVs 206 may be filled with gold, copper, aluminum, a gold compound, a copper compound, or an aluminum compound and may carry data, control, and address signals, as well as providing power and ground. It should be appreciated that if the potential on the vias that carry power are not the same as the substrate, it may be desirable to isolate the power vias from the substrate. In one or more embodiments, the TSVs 206 are simultaneously filled following alignment of the memory die 204 and the processor die 202. In this manner, the memory die 204 and the processor die 202 are mechanically and electrically connected. In one embodiment, the TSVs 206 are formed individually in the memory die 204 and the processor die 202. In another embodiment, the TSVs 206 are formed in the memory die 204 and the processor die 202 as a unit (i.e., the memory die 204 are aligned with the processor die 202 and the TSVs 206 are then formed (e.g., via etching)).

Stacking four of the memory die 204 on each side of the processor die 202 results in decreased inductance to an outer one of the memory die (as compared to an electronic assembly that locates all eight memory die on one side of a processor die) and may increase performance of the electronic assembly 200, as memory latency to outer memory die may be reduced and operating frequency may be increased. It should be noted that the TSVs 206, as well as extending through the memory die 204, extend through the processor die 202. In one or more embodiments, the processor die 202 includes accessible wire bond pads (not separately shown), on outer peripheries on one or both exterior surfaces, for coupling inputs/outputs of the processor die 202 to interconnect terminals of an associated package. Other techniques include, flip chip bumps, copper pillars, and contact pads. For example, the associated package may be a ball grid array (BGA), a quad flat package (QFP), or other integrated circuit package.

With reference to FIG. 3, an electronic assembly 300 is illustrated that is configured according to another embodiment the present disclosure. As is illustrated, the electronic assembly 300 includes two processor die 302 stacked back-to-back and four memory die (e.g., double data rate type 3 (DDR3) synchronous dynamic random access memory (SDRAM) die, or other type of memory die) 304 stacked on each side of the two processor die 302. While four stacked die are illustrated on each side of the two processor die, it is contemplated that more or less than four stacked die may be located on each side of the processor die in an electronic assembly configured according to the present disclosure. Moreover, it is contemplated that more than two processor die may be stacked in a processor die assembly configured according to the present disclosure.

As is illustrated, the memory die 304 and the processor die 302 are coupled to each other using through-silicon vias (TSVs) 306. For example, the TSVs 306 may be filled with gold, copper, aluminum, a copper compound, or an aluminum compound and may carry data, control, and address signals, as well as providing power and ground. In an alternative embodiment, the memory die are coupled to each other using TSVs and the memory stack is coupled to the processor die using solder balls or solder paste. Stacking four of the memory die 304 on each side of the two processor die 302 results in decreased inductance to an outer one of the memory die (as compared to an electronic assembly that locates all eight memory die on one side of a processor die) and may increase performance of the electronic assembly 300, as memory latency to outer memory die may be reduced and operating frequency may be increased.

It should be noted that in the electronic assembly 300 the TSVs 306 also extend through the processor die 302. In one or more embodiments, the processor die 302 includes accessible wire bond pads (not separately shown), on outer peripheries on one or both exterior surfaces, for coupling inputs/outputs of the processor die 302 to interconnect terminals of an associated package. For example, the associated package may be a ball grid array (BGA), a quad flat package (QFP), or other integrated circuit package.

With reference to FIG. 4, an assembly 400 (that includes multiple electronic assemblies 403 formed on a wafer 401) is illustrated that is configured according to another embodiment the present disclosure. As is illustrated, the electronic assemblies 403 each include one or more processor die 402 and four memory die (e.g., double data rate type 3 (DDR3) synchronous dynamic random access memory (SDRAM) die, or other type of memory die) 404 stacked on each side of the processor die 402. While four stacked die are illustrated on each side of the processor die 402, it is contemplated that more or less than four stacked memory die may be located on each side of a processor die in an electronic assembly configured according to the present disclosure.

As is illustrated, the memory die 404 and the processor die 402 are coupled to each other using through-silicon vias (TSVs) 406. For example, the TSVs 406 may be filled with gold, copper, aluminum, a gold compound, a copper compound, an aluminum compound, or other conductor and may carry data, control, and address signals, as well as providing power and ground. Stacking four of the memory die 404 on each side of the processor die 402 results in decreased inductance to an outer one of the memory die (as compared to an electronic assembly that locates all eight memory die on one side of a processor die) and may increase performance of the electronic assemblies 403, as memory latency to outer memory die may be reduced.

It should be noted that in the electronic assembly 400 the TSVs 406 also extend through the processor die 402. In one or more embodiments, the processor die 402 includes accessible wire bond pads (not separately shown), on outer peripheries on one or both exterior surfaces, for coupling inputs/outputs of the processor die 402 to interconnect terminals of an associated package. For example, the associated package may be a ball grid array (BGA), a quad flat package (QFP), or other integrated circuit package. It should also be appreciated that the electronic assemblies 403 may be singulated or packaged as a single unit and may be encapsulated (with various encapsulation materials) within an integrated circuit package.

It should be appreciated that the electronic assemblies 200, 300, and 400 may be fabricated using any number of known techniques. For example, an electronic assembly may be fabricated by first fabricating wafers including memory die and wafers including processor die. TSVs may then be formed through the memory die and the processor die via, for example, drilling or etching. Wafers including memory die and wafers including processor die may then be aligned and stacked in a desired configuration (e.g., four memory die wafers may be aligned and bonded together using adhesive films, which may include apertures where the TSVs are located, or fusion bonding and two processor die wafers may be aligned and bonded together using adhesive films or fusion bonding). The TSVs in the stacked wafers that include the memory die and the processor die may then be separately or continuously filled with a conductor. The die of the stacked wafers may then be singulated and the stacked memory die may then be attached to the processor die on each side, using, for example, solder balls between the processor die and adjacent ones of the stacked memory die to electrically connect the processor die to the memory die.

As another example, an electronic assembly may be fabricated by first fabricating wafers including memory die and wafers including processor die. TSVs may then be formed through the memory die and the processor die via drilling or etching. Wafers including memory die and wafers including processor die may then be aligned and stacked in a desired configuration (e.g., four memory die wafers may be aligned and bonded together using adhesive films or fusion bonding and two processor die wafers may be aligned and bonded together using adhesive films or fusion bonding). The die of the stacked wafers may then be singulated and the stacked memory die may then be attached to the processor die on each side, using, for example, adhesive films or fusion bonding between the processor die and adjacent ones of the stacked memory die. The TSVs in the stacked memory/processor die may then be filled (e.g., separately or continuously) with a conductor to electrically connect the memory and processor die.

As yet another example, an electronic assembly may be fabricated by first fabricating wafers including memory die and wafers including processor die. TSVs may then be formed through the memory die and the processor die via drilling or etching. The die of the wafers may then be singulated. The memory die and the processor die may then be aligned and stacked in a desired configuration (e.g., four memory die may be aligned on each side of a processor die). The TSVs in the stacked memory/processor die may then be filled (e.g., separately or continuously) with a conductor to electrically connect the memory and processor die.

Although the invention is described herein with reference to specific embodiments, various modifications and changes can be made without departing from the scope of the present invention as set forth in the claims below. For example, the techniques disclosed herein are generally broadly applicable to systems that facilitate data processing. Accordingly, the specification and figures are to be regarded in an illustrative rather than a restrictive sense, and all such modifications are intended to be included with the scope of the present invention. Any benefits, advantages, or solution to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An electronic assembly, comprising:
one or more processor die assemblies;
a plurality of non-processor die assemblies; and
through-die vias coupling the plurality of non-processor die assemblies to each of a respective one of the one or more processor die assemblies and wherein the through-die vias include power vias, ground vias, address vias, data vias, and control vias;
wherein each processor die assembly of the one or more processor die assemblies has an even number of a same type of the plurality of non-processor die assemblies symmetrically positioned on a first side of the processor die assembly and a second side of the processor die assembly.

2. The electronic assembly of claim 1, wherein the through-die vias include through-silicon vias.

3. The electronic assembly of claim 1, wherein the plurality of non-processor die assemblies includes four memory die in a stacked configuration.

4. The electronic assembly of claim 1, wherein the through-die vias are at least partially filled with copper.

5. The electronic assembly of claim 1, wherein the through-die vias are at least partially filled with aluminum.

6. The electronic assembly of claim 1, wherein the plurality of non-processor die assemblies include an equal number of memory die and the through-die vias extend through the one or more processor die assemblies and the plurality of non-processor die assemblies.

7. The electronic assembly of claim 1, wherein the one or more processor die assemblies only include a single processor die.

8. An electronic assembly, comprising:
a plurality of processor die assemblies;
a plurality of non-processor die assemblies; and
through-silicon vias coupling the plurality of non-processor die assemblies to the plurality of processor die assemblies and wherein the through-silicon vias include power vias, ground vias, address vias, data vias, and control vias;
wherein at least two processor die assemblies of the plurality of processor die assemblies are stacked back to back; and
wherein the at least two processor die assemblies, stacked back to back, have an even number of a same type of the plurality of non-processor die assemblies symmetrically positioned on a first side of the at least two processor die assemblies, stacked back to back, and a second side of the at least two processor die assemblies, stacked back to back.

9. The electronic assembly of claim 8, wherein the plurality of non-processor die assemblies includes a plurality of memory die.

10. The electronic assembly of claim 8, wherein the through-silicon vias are at least partially filled with copper.

11. The electronic assembly of claim 8, wherein the through-silicon vias are at least partially filled with aluminum.

12. The electronic assembly of claim 8, wherein the plurality of non-processor die assemblies include an equal number of memory die and the through-silicon vias extend through the at least two processor die assemblies, stacked back to back.

13. An electronic assembly, comprising:
one or more first processor die assemblies;
a plurality of non-processor die assemblies; and
first through-silicon vias coupling at least a first two non-processor die assemblies of the plurality of non-processor die assemblies to a first processor die assembly of the one or more processor die assemblies, wherein each of the at least first two non-processor die assemblies of the plurality of non-processor die assemblies include a respective memory die, and wherein the first through-silicon vias include power vias, ground vias, address vias, data vias, and control vias;
wherein each processor die assembly of the one or more processor die assemblies has an even number of a same type of the plurality of non-processor die assemblies symmetrically positioned on a first side of the processor die assembly and a second side of the processor die assembly.

14. The electronic assembly of claim 13, wherein the first through-silicon vias are at least partially filled with copper or aluminum.

15. The electronic assembly of claim 13,
wherein the one or more processor die assemblies include a second processor die assembly, wherein the one or more processor die processor die assemblies are included within a single wafer;
the electronic assembly further comprising:
second through-silicon vias coupling at least a second two non-processor die assemblies of the plurality of non-processor die assemblies to the second processor die assembly, wherein each of the at least second two non-processor die assemblies of the plurality of non-processor die assemblies include a respective memory die, and wherein the second through-silicon vias include power vias, ground vias, address vias, data vias, and control vias.

16. The electronic assembly of claim 15, wherein the first and second through-silicon vias are at least partially filled with a conductor.

17. The electronic assembly of claim 1, wherein at least two of the plurality of non-processor die assemblies include at least one of synchronous dynamic random access memory (SRAM) and double data rate (DDR) memory.

18. The electronic assembly of claim 8, wherein at least two of the plurality of non-processor die assemblies include at least one of synchronous dynamic random access memory (SRAM) and double data rate (DDR) memory.

19. The electronic assembly of claim 13, wherein at least two of the plurality of non-processor die assemblies include at least one of synchronous dynamic random access memory (SRAM) and double data rate (DDR) memory.

* * * * *